United States Patent
You

(10) Patent No.: US 10,126,978 B2
(45) Date of Patent: Nov. 13, 2018

(54) MEMORY DEVICE DETECTING LAST ERASED PAGE, MEMORY SYSTEM HAVING THE SAME, AND OPERATING METHOD THEREOF

(71) Applicant: SK hynix Inc., Gyeonggi-do (KR)

(72) Inventor: Byoung Sung You, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/395,772

(22) Filed: Dec. 30, 2016

(65) Prior Publication Data

US 2018/0052638 A1 Feb. 22, 2018

(30) Foreign Application Priority Data

Aug. 19, 2016 (KR) .................. 10-2016-0105759

(51) Int. Cl.
*G11C 16/16* (2006.01)
*G06F 3/06* (2006.01)

(52) U.S. Cl.
CPC .......... *G06F 3/0653* (2013.01); *G06F 3/0604* (2013.01); *G06F 3/0647* (2013.01); *G06F 3/0673* (2013.01); *G11C 16/16* (2013.01)

(58) Field of Classification Search
CPC .... G06F 3/0653; G06F 3/0673; G06F 3/0604; G06F 3/0647; G11C 16/16; G11C 16/02
See application file for complete search history.

(56) References Cited

U.S. PATENT DOCUMENTS

| 9,524,791 | B1* | 12/2016 | Kim | ................. G11C 16/30 |
| 2012/0203953 | A1* | 8/2012 | Abasto | ............ G06F 12/0246 711/103 |
| 2014/0258611 | A1* | 9/2014 | Won | ................. G11C 7/02 711/114 |
| 2015/0006939 | A1* | 1/2015 | Lim | ................. G11C 5/148 713/324 |
| 2016/0103730 | A1* | 4/2016 | Ke | ................. G06F 13/00 714/6.11 |
| 2017/0139784 | A1* | 5/2017 | Ke | ................. G06F 3/0619 |

FOREIGN PATENT DOCUMENTS

| KR | 1020080026393 | 3/2008 |
| KR | 1020150045747 | 4/2015 |
| KR | 1020160016422 | 2/2016 |

* cited by examiner

*Primary Examiner* — Khamdan N. Alrobaie
(74) *Attorney, Agent, or Firm* — IP & T Group LLP

(57) ABSTRACT

A memory system includes a memory controller transferring a search command, and a memory device searching a plurality of pages a memory device operatively coupled to a memory controller, the memory device being suitable for detecting a last erased page among a plurality of pages included in a memory block of the memory device, and for providing an address of the last erased page to the memory controller, and the memory controller is configured to control the memory device according to the address of the last erased page.

19 Claims, 13 Drawing Sheets

MEMORY DEVICE DETECTING LAST ERASED PAGE, MEMORY SYSTEM HAVING THE SAME, AND OPERATING METHOD THEREOF

CROSS-REFERENCE TO RELATED APPLICATION

The present application claims priority under 35 U.S.C. § 119(a) to Korean patent application number 10-2016-0105759, filed on Aug. 19, 2016, the entire disclosure of which is incorporated herein by reference in its entirety.

BACKGROUND

Field of Invention

Various embodiments of the invention relate generally to a semiconductor memory device, and more particularly, to a semiconductor memory device capable of determining the status of a page including therein, a memory system comprising the same, and an operating method thereof.

Description of Related Art

A memory system may include a storage device for storing data and a memory controller provided between the storage device and an external device for controlling transmission of commands, addresses and data between the storage device and the external device.

The storage device of the memory system may include a plurality of semiconductor memory devices (hereinafter referred to simply as memory devices). Memory devices are typically classified into volatile and non-volatile memory devices. An external device coupled to a memory system is generally called a host. The external device may communicate with the storage device by using an interface protocol such as, for example, a Peripheral Component Interconnect-Express PCI-ED, an Advanced Technology Attachment (ATA), a Serial ATA (SATA), a Parallel ATA (PATA), or a serial attached SCSI (SAS), a Universal Serial Bus (USB), an MMC (Multi-Media Card), an ESDI (Enhanced Small Disk Interface), and an Integrated Drive Electronics (IDE).

Continuous demand for faster, higher capacitance portable electronic devices requires continuous improvements in the memory devices and memory systems that are employed by the electronic portable devices.

SUMMARY

Various embodiments are directed to a memory device performing an operation of determining a status of pages included in a memory block in the memory device when a memory system is powered on, a memory system having the same, and an operating method thereof.

According to an embodiment, a memory system may include a memory device operatively coupled to a memory controller, the memory device being suitable for detecting a last erased page among a plurality of pages included in a memory block of the memory device, and for providing an address of the last erased page to the memory controller, and the memory controller is configured to control the memory device according to the address of the last erased page.

According to an embodiment, a method of operating a memory system may include setting two among a plurality of pages included in a memory block as first and second pages according to addresses, setting a page located between the first and second pages as a third page, determining whether the third page is a programmed page or an erased page, and repeating the setting of the first and second pages, the setting of the third page, and the determining by performing the setting of the first and second pages such that the first page is moved toward the second page when the third page is determined as the programmed page or such that the second page is moved toward the first page when the third page is determined as the erased page.

According to an embodiment, a method of operating a memory system may include outputting a search command and addresses from a memory controller, selecting a memory block in response to the search command and the addresses, calculating a first address and a second address included in the addresses to set an address between the first and second addresses as a third address, determining whether a page corresponding to the third address among pages included in the selected memory block is programmed or erased, and repeating the calculating and the determining by changing the third address in the range between the first and second addresses until the page corresponding to the third address determined as the erased page is detected as a last erased page.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
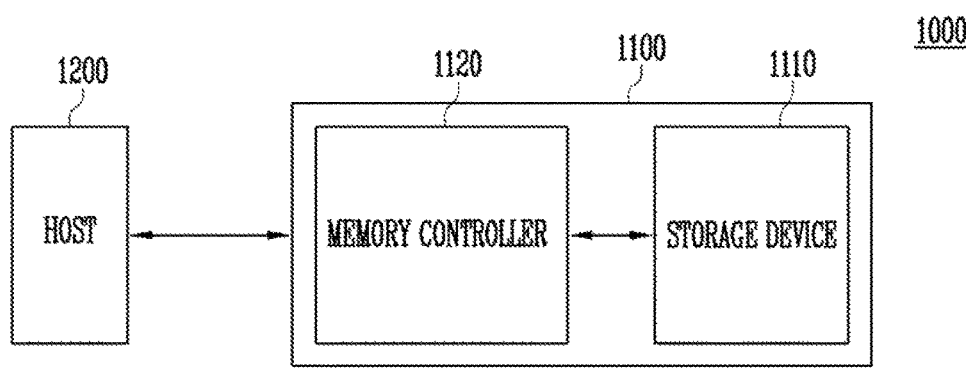
FIG. 1 is a diagram illustrating a memory system coupled to a host, according to an embodiment of the present invention.

Hereinafter, various exemplary embodiments will be described in detail with reference to the accompanying drawings. It is noted, however, that the present disclosure may be embodied in various other forms, and should not be construed as being limited only to the illustrated embodiments herein. Rather, these embodiments are provided as examples so that this disclosure will be thorough and complete, and will fully convey the various aspects and features of the present invention to those skilled in the art to which the present invention pertains.

It is noted that the drawings are not drawn in scale and dimensions of components may be exaggerated for convenience of illustration. Also, it is noted that in the following description, detailed descriptions of well-known functions and constitutions may be omitted for simplicity and conciseness and to avoid obfuscating the present disclosure with well-known structures and processes. Like reference numerals refer to like elements throughout the specification and drawings.

It is further noted that in this specification, "connected/coupled" refers to one component not only directly coupling another component but also indirectly coupling another component through an intermediate component.

It will be further understood that, although terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The phrase "at least one of . . . and . . . ," when used herein with a list of items, means a single item from the list or any combination of items in the list. For example, "at least one of A, B, and C" means, only A, or only B, or only C, or any combination of A, B, and C.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a diagram illustrating a memory system 1100, according to an embodiment of the present invention.

Referring to FIG. 1, the memory system 1100 may include a storage device 1110 suitable for storing data and a memory controller 1120 suitable for controlling the storage device 1110. The memory system 1100 may be coupled to a host 1200. The memory system 1100 may store data provided from the host 1200 in response to a program request (also referred to as a write request) received from the host 1200. The memory system 1100 may output stored data to the host 1200 in response to a read request from the host 1200.

The host 1200 may communicate with the memory system 1100 by using any suitable interface protocol, such as, for example, a Peripheral Component Interconnect-Express (PCI-E), an Advanced Technology Attachment (ATA), a Serial ATA (SATA), a Parallel ATA (PATA), and a serial attached SCSI (SAS). However, the interface protocols between the host 1200 and the memory system 1100 are not limited thereto. Other suitable interface protocols may include, for example, a Universal Serial Bus (USB), a Multi-Media Card (MMC), an Enhanced Small Disk Interface (ESDI), and an IDE (Integrated Drive Electronics).

The memory controller 1120 may control an operation of the memory system 1100. For example, the memory controller may control a data exchange between the host 1200 and the storage device 1110. The memory controller 1120 may control the storage device 1110 to perform at least one of a program, a read and an erase operation in response to a request of the host 1200. The memory controller 1120 may determine a status of the storage device 1110 when the memory system 1100 is powered on. Information about the status of the storage device 1110 may be provided to and stored in the memory controller 1120. However, information stored in the memory controller 1120 may not be reliable since information of the storage device 1110 may not be reliably provided to the memory controller 1120 when the memory system 1100 is suddenly powered off. In order to overcome unreliability of the memory system 1100, the memory controller 1120 may control the storage device 1110 to perform an operation of determining the status of the storage device 1110 when the memory system 1100 is powered on.

The storage device 1110 may include a plurality of memory devices, including, but not limited to Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM) or FLASH Memory. According to an embodiment of the present invention, when the memory system 1100 is powered on, the memory controller 1120 provides the storage device 1110 with a command to check a status of the storage device 1110 and the storage device 1110 may then perform a status determination operation and provide the memory controller 1120 with a result (information) of the status determination operation (also referred to hereinafter as "memory device status information" or simply "status information".

Figure 2:
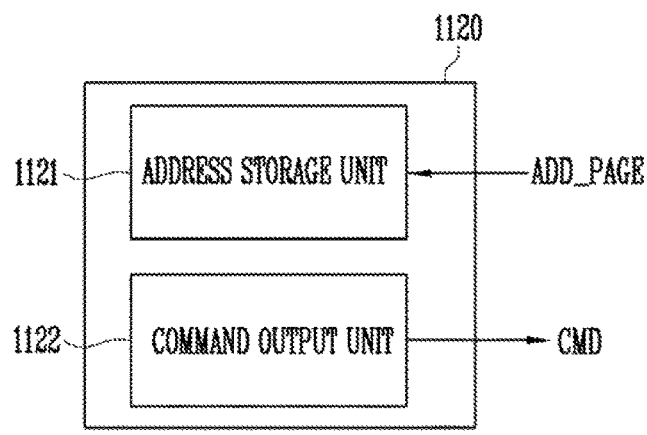
FIG. 2 is a diagram illustrating an exemplary configuration of a memory controller employed in the memory system of FIG. 1.

FIG. 2 is a diagram illustrating an exemplary configuration of the memory controller 1120.

As described above with reference to FIG. 1, the memory controller 1120 may include a plurality of devices for controlling data exchange between the host 1200 and the storage device 1110. It is noted that FIG. 2 illustrates only those units which relate to an embodiment of the invention. Various other well-known elements may also be included in the memory controller 1120 as it should be understood by those skilled in the art to which the present invention pertains.

Referring to FIG. 2, the memory controller 1120 may include an address storage unit 1121 and a command output unit 1122.

Information about various addresses relating to the storage device 1110 may be stored in the address storage unit 1121. For example, information about addresses relating to a particular status of the storage device 1110 may be stored in the address storage unit 1121. For example, the addresses may include an address of the last programmed page or an address of the last erased page and addresses of a plane and a memory block which include the last programmed and/or the erased page. The last programmed page is a page which is programmed last before the memory system 1100 is powered off. The last erased page is a page which is erased last before the memory system 1100 is powered off. In addition, when the memory system 1100 is powered on, the memory controller 1120 may receive a last erased page address ADD_PAGE from the storage device 1110. The memory controller 1120 may output a command and an address to the storage device 1110 on the basis of the information stored in the address storage unit 1121.

The command output unit 1122 may output a command CMD to the storage device 1110 when the memory system 1100 is powered on.

Figure 3:
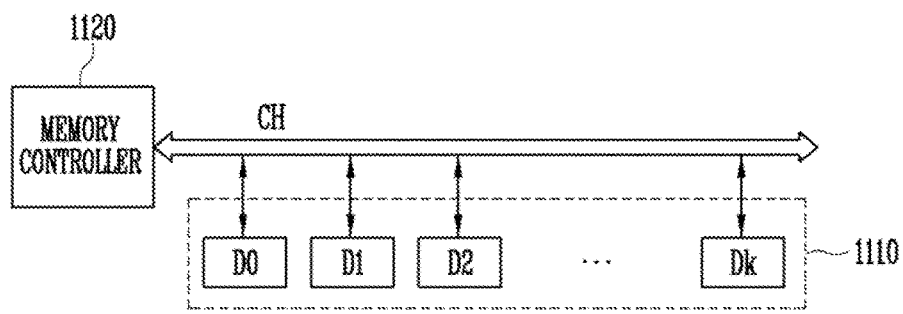
FIG. 3 is a diagram illustrating an exemplary connection relationship between a memory controller and a storage device of the memory system of FIG. 1.

FIG. 3 is a diagram illustrating an exemplary connection relationship between the memory controller 1120 and the storage device 1110.

Referring to FIG. 3, the storage device 1110 may include a plurality of memory devices D0 to Dk (where k is a positive integer). The memory devices D0 to Dk may be coupled to the memory controller 1120 through a channel CH. For example, commands, addresses and data may be transferred between the memory controller 1120 and the storage device 1110 through the channel CH. More specifically, one or more selected memory devices, among the plurality of memory devices D0 to Dk may communicate with the memory controller 1120 through the channel CH.

The memory devices D0 to Dk may include volatile memory devices or non-volatile memory devices. In an embodiment, the memory devices D0 to Dk may include non-volatile memory devices which can retain data even in the absence of power supply. For example, the memory devices D0 to Dk may include NAND flash memory devices. In an embodiment, the memory system 1100 may be employed in a portable electronic device.

The memory device is described in detail below by taking one of the above-described memory devices D0 to Dk as an example.

Figure 4:
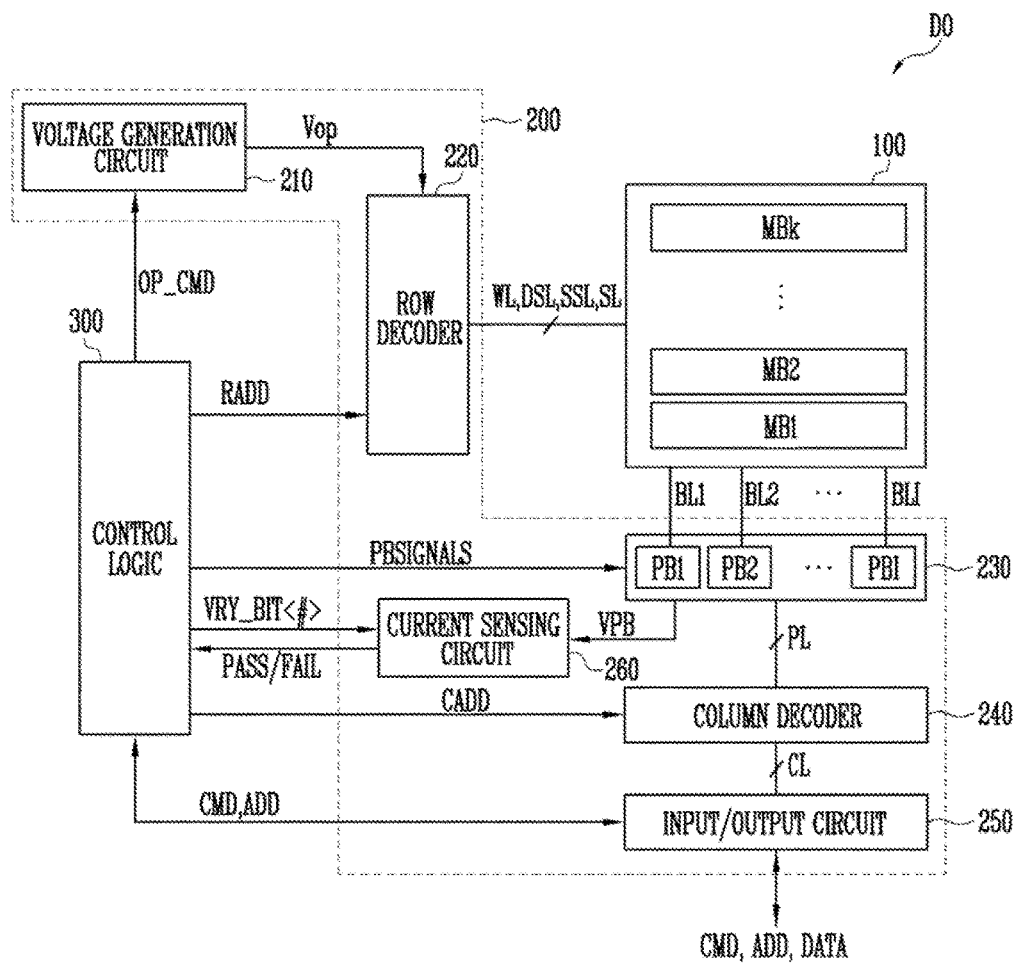
FIG. 4 is a diagram illustrating a memory device, according to an embodiment of the present invention.

FIG. 4 is a diagram illustrating an exemplary configuration of a memory device D0 among the plurality of memory devices D0 to Dk employed shown in FIG. 3.

Referring to FIG. 4, the storage device 1110 may include a memory device D0 including a memory cell array 100 suitable for storing data, a peripheral circuit 200 and a control logic 300 suitable for controlling the peripheral circuit 200. The peripheral circuit 200 may perform a program operation to store data in the memory cell array 100, a read operation to output the stored data, and an erase operation to erase the stored data.

The memory cell array 100 may include a plurality of memory blocks MB1 to MBk (where k is a positive integer). Word lines WL, drain selection lines DSL, source selection lines SSL, a source line SL and bit lines BL1 to BLI (where I is a positive integer) may be respectively coupled to the memory blocks MB1 to MBk. For each of the memory blocks MB1 to MBk there may correspond a plurality of dedicated word lines WL, drain selection lines DSL and source selection lines SSL. The source line SL may be coupled in common to the plurality of memory blocks MB1 to MBk, and the bit lines BL1 to BLI may also be coupled in common to the memory blocks MB1 to MBk.

The peripheral circuit 200 may include a voltage generation circuit 210, a row decoder 220, a page buffer unit 230, a column decoder 240, an input/output circuit 250 and a current sensing circuit 260.

The voltage generation circuit 210 may generate the various operating voltages Vop which are applied to perform a program, a read or an erase operation in response to an operation signal OP_CMD received from the control logic 300. For example, the voltage generation circuit 210 may generate and transfer to the row decoder 220 one or more operating voltages Vop including at least one of a program voltage, a read voltage, an erase voltage, a pass voltage and a turn on voltage.

The row decoder 220 may transfer the one or more operating voltages Vop to the word lines WL, the drain selection lines DSL, the source selection lines SSL and the source line SL which are coupled to a memory block which is selected in response to a row address RADD received from the control logic 300.

The page buffer unit 230 may include a plurality of page buffers PB1 to PBI coupled to the bit lines BL1 to BLI, respectively. Each of the page buffers PB1 to PBI may be coupled to a corresponding bit line among the plurality of bit lines BL1 to BLI. The page buffers PB1 to PBI may operate in response to page buffer control signals PBSIGNALS received from the control logic 300. For example, the page buffers PB1 to PBI may temporarily store data received through the bit lines BL1 to BLI, or sense a voltage or current in the bit lines BL1 to BLI during a read or verify operation.

The column decoder 240 may transfer data between the input/output circuit 250 and the page buffer unit 230 in response to a column address CADD received from the control logic 300. For example, the column decoder 240 may exchange data with the page buffers PB through a plurality of page lines PL, or exchange data with the input/output circuit 250 through a plurality of column lines CL.

The input/output circuit 250 may manage input and output of the command CMD, the address ADD and data DATA of the memory device D0. For example, the input/output circuit 250 may transfer the command CMD and the address ADD from the memory controller 1120 to the control logic 300, or exchange the data DATA with the column decoder 240.

The current sensing circuit 260 may generate a reference current in response to an allowed bit number signal VRY_BIT<#> during a read operation, a verify operation, or a status detect operation, may compare the reference current with sensing voltages VPB provided from the page buffer unit 230, and may output a pass signal PASS or a fail signal FAIL according to a comparison result.

The control logic 300 may control the peripheral circuits 200 by outputting the operation signal OP_CMD, the row address RADD, the page buffer control signal PBSIGNALS and the allowed bit number signal VRY_BIT<#> in response to the command CMD and the address ADD. In addition, the control logic 300 may determine whether or not a selected page is programmed or erased according to a pass or fail signal PASS or FAIL received from the current sensing circuit. For example, the control logic 300 may determine that a selected page is a programmed page when receiving the pass signal PASS, or determine the selected page as an erased page when receiving the fail signal FAIL. The control logic may also determine whether an erased page is a last erased page or not. The control logic 300 may provide the address of the last erased page to the memory controller 1120 through the input/output circuit 250.

Figure 5:
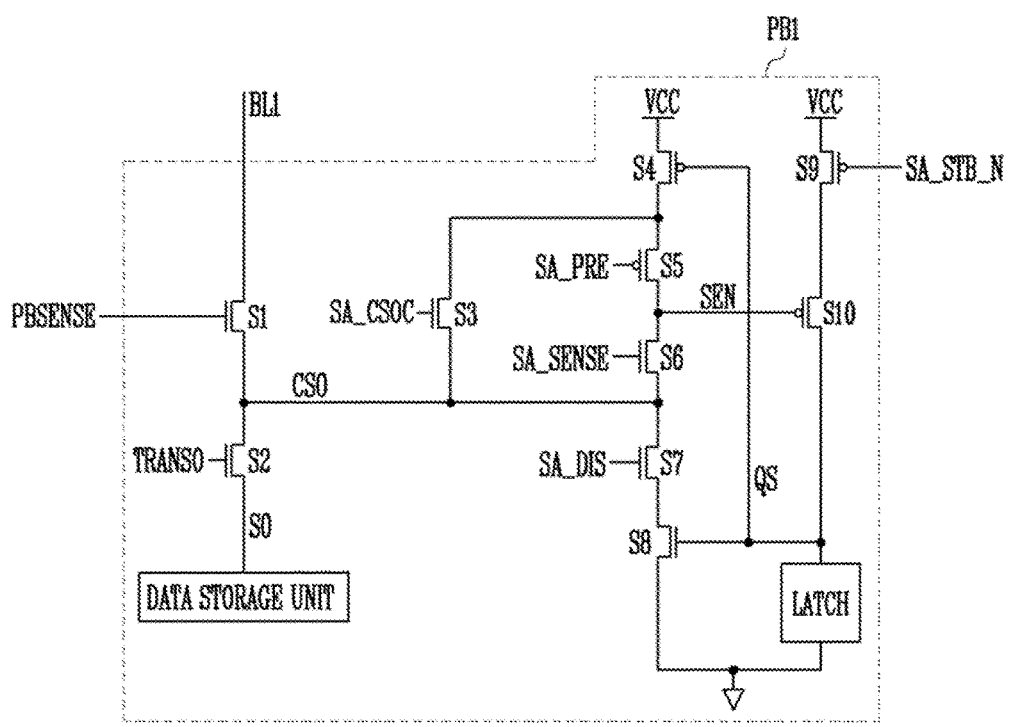
FIG. 5 is a diagram illustrating an exemplary configuration of a page buffer employed in the memory device of FIG. 4.

FIG. 5 is a diagram illustrating an exemplary configuration of one of the page buffers shown in FIG. 4.

The first to Ith page buffers PB1 to PBI of FIG. 4 may have the same configuration as each other. Thus, FIG. 5 illustrates one of the page buffers, e.g., the first page buffer PB1.

Referring to FIG. 5, the first page buffer PB1 may be coupled to the first bit line BL1 and may include first to tenth switches S1 to S10. Signals PBSENSE, TRANSO, SA_CSOC, SA_PRE, SA_SENSE, SE_DIS and SA_STB_N which are applied to control the first to tenth switches S1 to S10, respectively, may be included in the page buffer control signals PBSIGNALS of FIG. 4.

The first switch S1 may include an NMOS transistor coupling the first bit line BL1 and a first current sensing node CSO to each other in response to a sensing signal PBSENSE. The second switch S2 may include an NMOS transistor coupling the first current sensing node CSO and a sensing node SO to each other in response to a transfer signal TRANSO. The sensing node SO may be coupled to a data storage unit and the current sensing circuit 260 shown in FIG. 4 during a sensing operation. A voltage applied to the sensing node SO during the sensing operation may be transferred as the sensing voltage VPB to the current sensing circuit 260 as shown in FIG. 4. For example, the sensing nodes SO of the first to Ith page buffers PB1 to PBI may be coupled in common to the current sensing circuit 260 during the sensing operation. Voltage transferred from the first to Ith page buffers PB1 to PBI to the current sensing circuit 260 may be the sensing voltages VPB.

The third switch S3 may include an NMOS transistor coupling the first current sensing node CSO to a node between a fourth switch S4 and a fifth switch S5 in response to a precharge transmission signal SA_CSOC. The fourth switch S4 may include a PMOS transistor coupling a power source terminal VCC and the fifth switch S5 to each other according to a potential level of a data node QS. The potential level of the data node QS may vary depending on the data stored in a latch. The potential level of the data node QS may be initialized to a low level. The fifth switch S5 may include a PMOS transistor for transferring a power voltage which is received through the fourth switch S4 from the power source terminal VCC to a second current sensing node SEN in response to a precharge signal SA_PRE. The sixth switch S6 may include an NMOS transistor coupling the second current sensing node SEN to the first current sensing node CSO in response to a sensing transmission signal SA_SENSE.

The seventh switch S7 may include an NMOS transistor coupling the first current sensing node CSO to the eighth switch S8 in response to a discharge signal SA_DIS. The eighth switch S8 may include an NMOS transistor coupling the seventh switch S7 to a ground terminal in response to a potential level of the data node QS. The data node QS is coupled to the latch and to the gates of the fourth and the eight switches S7 and S8.

The ninth switch S9 may include a PMOS transistor coupling a power supply terminal VCC to the tenth switch S10 in response to a strobe signal SA_STB_N. The tenth switch S10 may include a PMOS transistor forming a current path between the ninth switch S9 and the latch in response to a potential level of the second current sensing node SEN.

Operations of the above-described first page buffer PB1 are described below.

A precharge operation may be performed to precharge the first bit line BL1 to a positive voltage. During the precharge operation, data '0' may be stored in the latch. The data node QS may be initialized to a low level by the data '0'. When the data node QS has a low potential level, the fourth switch S4 may be turned on. When the third and first switches S3 and S1 are turned on in response to the precharge transmission signal SA_CSOC and the sensing signal PBSENSE, a current path may be formed by the fourth, third and first switches S4, S3 and S1. As a result, the first bit line BL1 and the power source terminal VCC may be coupled to each other, so that the first bit line BL1 may be precharged to a positive voltage. In addition to the above method, various other methods may be used to precharge the first bit line BL1.

When the first bit line BL1 is precharged, the third and fifth switches S3 and S5 may be turned off in response to the precharge transmission signal SA_CSOC and the sensing signal PBSENSE, so that supply of a precharge voltage to the first current sensing node CSO may be stopped. Subsequently, when a verify voltage is applied to a selected word line, a potential of the first bit line BL1 may be maintained at a precharge level, or be reduced. A sensing operation may then be performed to sense the potential of the first bit line BL1.

During the sensing operation, since the first and sixth switches S1 and S6 are turned on, the tenth switch S10 may be turned on or off depending on the potential of the first current sensing node CSO. Subsequently, when the ninth switch S9 is turned on by the strobe signal SA_STB_N, the data QS stored in the latch may remain as the previous data or be changed depending on whether the tenth switch S10 is turned on or off. On the assumption that the time between a time point when the fifth switch S5 is turned off and a time point when the ninth switch S9 is turned on is the strobe time, the amount of current consumed to perform a verify operation may be varied.

Figure 6:
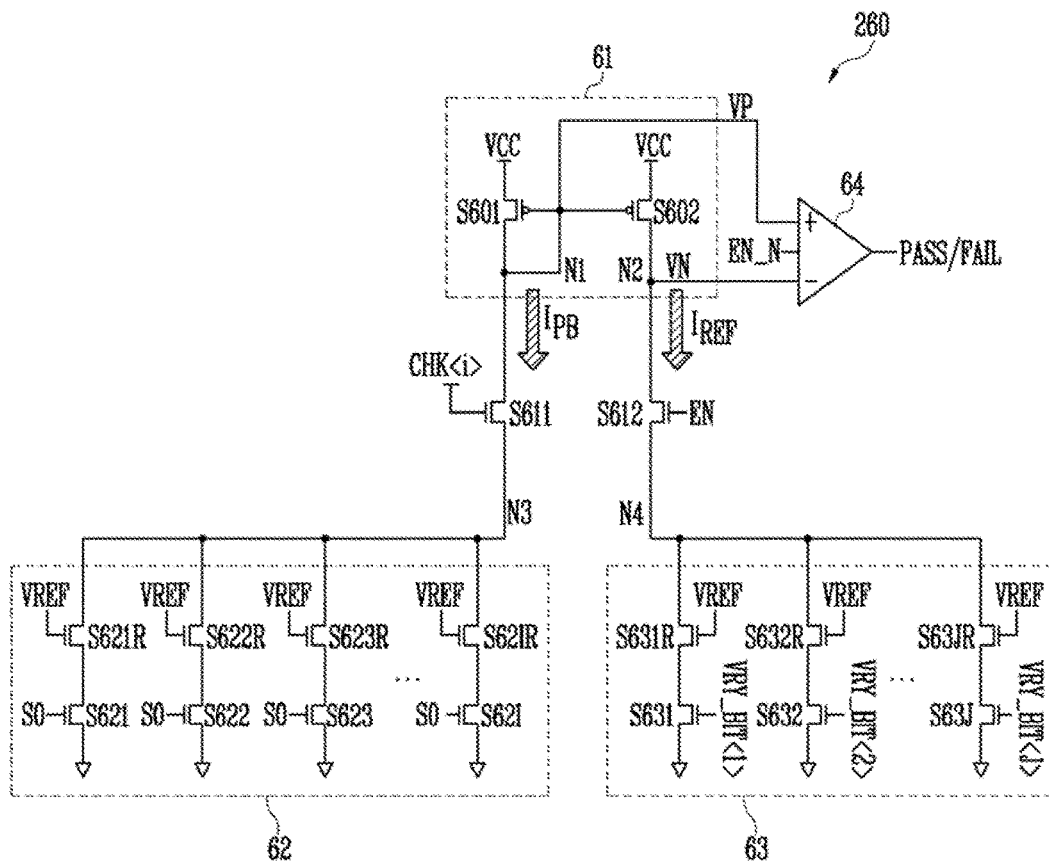
FIG. 6 is a diagram illustrating an exemplary configuration of a current sensing circuit employed in the memory device of FIG. 4.

FIG. 6 is a diagram illustrating an exemplary configuration of the current sensing circuit 260.

Referring to FIG. 6, the current sensing circuit 260 may output the pass signal PASS when the number of fail bits is less than the number of allowed bits, and output the fail signal FAIL when the number of fail bits exceeds the number of allowed bits. The number of fail bits may be determined on the basis of the sensing voltages VPB provided from the first to Ith page buffers PB1 to PBI. The number of allowed bits may be determined on the basis of the allowed bit number signal VRY_BIT<#> provided from the control logic 300. For example, since a fail cell refers to a memory cell having a lower threshold voltage than a target voltage, the number of fail bits may increase as the number of fail cells increases. Therefore, the number of fail bits may decrease as the number of program loops increases. The number of allowed bits may remain constant according to information stored in the control logic 300.

The current sensing circuit 260 may include a voltage generation circuit 61, a chunk enable switch S611, an enable switch S612, a fail bit counter 62, an allowed bit counter 63 and a comparator 64.

The voltage generation circuit 61 may generate a pass voltage VP and a fail voltage VN according to a fail bit current $I_{PB}$ and a reference current $I_{REF}$. For example, the voltage generation circuit 61 may generate the fail voltage VN greater than the pass voltage VP when the fail bit current $I_{PB}$ increases, and generate the pass voltage VP greater than the fail voltage VN when the fail bit current $I_{PB}$ decreases. The voltage generation circuit 61 may include a first switch S601 and a second switch S602. The first switch S601 may include a PMOS transistor coupled between a first node N1 and a power voltage VCC. The first switch S601 may be turned on or off in response to a voltage of the first node N1.

The second switch S602 may include a PMOS transistor coupled between a second node N2 and the power voltage VCC, and turned on or off in response to a voltage of the first node N1. A current flowing through the first node N1 may be the fail bit current $I_{PB}$ and the voltage thereof may be the pass voltage VP. A current flowing through the second node N2 may be the reference current $I_{REF}$ and the voltage thereof may be the fail voltage VN. Therefore, when the fail bit current $I_{PB}$ increases, the pass voltage VP may decrease, and when the fail bit current $I_{PB}$ decreases, the pass voltage VP may increase. In addition, when the reference current $I_{REF}$ increases, the fail voltage VN may decrease, and when the reference current $I_{REF}$ decreases, the fail voltage VN may increase.

The chunk enable switch S611 may be coupled between the first node N1 and a third node N3. The chunk enable switch S611 may be composed of an NMOS transistor turned on or off in response to a chunk voltage CHK<i> corresponding to voltages of internal nodes of the page buffers grouped in units of chunks.

The enable switch S612 may include an NMOS transistor coupled between the second node N2 and a fourth node N4 and turned on or off in response to an enable signal EN for a pass/fail determination operation.

The fail bit counter 62 may be configured to control a current of the third node N3 depending on the sensing voltages VPB transferred through the sensing nodes SO of the page buffers. The fail bit counter 62 may include a plurality of fail bit reference switches S621R to S62IR and a plurality of fail bit switches S621 to S62I. The fail bit reference switches S621R to S62IR may be commonly coupled to the third node N3. The fail bit switches S621 to S62I may be coupled in series to the fail bit reference switches S621R to S62IR, respectively. For example, the first fail bit reference switch S621R and the first fail bit switch S621 may be coupled in series between the third node N3 and a ground terminal. In the same manner, the Ith fail bit reference switch S62IR and the Ith fail bit switch S62I may be coupled in series between the third node N3 and the ground terminal.

Each of the plurality of fail bit reference switches S621R to S62IR may include an NMOS transistor turned on or off in response to a reference voltage VREF. Gates of the fail bit switches S621 to S62I may be coupled to the sensing nodes SO of the page buffers, respectively. The voltages of the sensing nodes SO are defined as the sensing voltages VPB, and thus a fail bit may be represented by a high sensing voltage. Each of the plurality of fail bit switches S621 to S62I may include an NMOS transistor turned on when a high voltage is applied to gate thereof. Therefore, the number of fail bit switches S621 to S62I turned on may increase as the number of fail bits increases. The current flowing through the third node N3 may also increase when the number of fail bit switches S621 to S62I turned on increases.

The allowed bit counter 63 may be configured to maintain the reference current $I_{REF}$ flowing through the fourth node N4 constant according to the allowed bit number signal VRY_BIT<#>. In other words, although the reference current $I_{REF}$ of the fourth node N4 varies depending on the allowed bit number signal VRY_BIT<#>, since the allowed bit number signal VRY_BIT<#> remains constant, the reference current $I_{REF}$ flowing through the fourth node N4 may also remain constant. The allowed bit number signal VRY_BIT<#> may vary according to different types of memory devices in consideration of error correction code (ECC) performance.

The allowed bit counter 63 may include a plurality of allowed bit reference switches S631R to S63JR and a plurality of allowed bit switches S631 to S633. The allowed bit reference switches S631R to S63JR may be commonly coupled to the fourth node N4. The allowed bit switches S631 to S633 may be coupled in series to the allowed bit reference switches S631R to S63JR, respectively. For example, the first allowed bit reference switch S631R and the first allowed bit switch S631 may be coupled in series between the fourth node N4 and the ground terminal. In the same manner, the Jth fail bit reference switch S62JR and the Jth fail bit switch S623 may be coupled in series between the fourth node N4 and the ground terminal.

Each of the plurality of allowed bit reference switches S631R to S63JR may include an NMOS transistor turned on or off in response to the reference voltage VREF. Each of the plurality of the allowed bit switches S631 to S63I may include an NMOS transistor turned on or off in response to corresponding one among allowed bit number signals VRY_BIT<J:1> provided from the control logic 300. Therefore, as the number of allowed bits increases or as a number of allowed bits of logic high level among the allowed bit number signals VRY_BIT<J:1> increases, the number of allowed bit switches S631 to S63I which are turned on may increase. When the number of allowed bit switches S631 to S63I which are turned on increases, the reference current $I_{REF}$ flowing through the fourth node N4 may also increase.

As described above, the reference current $I_{REF}$ flowing through the fourth node N4 may remain constant according to the allowed bit number signals VRY_BIT<J:1>, whereas the fail bit current $I_{PB}$ flowing through the third node N3 may vary depending on a fail bit of each program loop. Therefore, when both the chunk enable switch S611 and the enable switch S612 are turned on, the pass voltage VP may be generated by the fail bit current $I_{PB}$ flowing through the third node N3, and the fail voltage VN may be generated by the reference current $I_{REF}$ flowing through the fourth node N4.

The comparator 64 may compare the pass voltage VP with the fail voltage VN in response to an enable inversion signal EN_N and output the pass signal PASS or the fail signal FAIL according to the comparison result. For example, the pass voltage VP may be applied to a plus terminal (+) of the comparator 64, and the fail voltage VN may be applied to a minus terminal (−). Therefore, the comparator 64 may output the pass signal PASS when the pass voltage VP is greater than the fail voltage VN, and the fail signal FAIL when the fail voltage VN is greater than the pass voltage VP. The control logic 300 may receive the pass signal PASS or the fail signal FAIL and control the peripheral circuits 200 to perform subsequent operations according to the provided pass signal PASS or fail signal FAIL.

Figure 7:
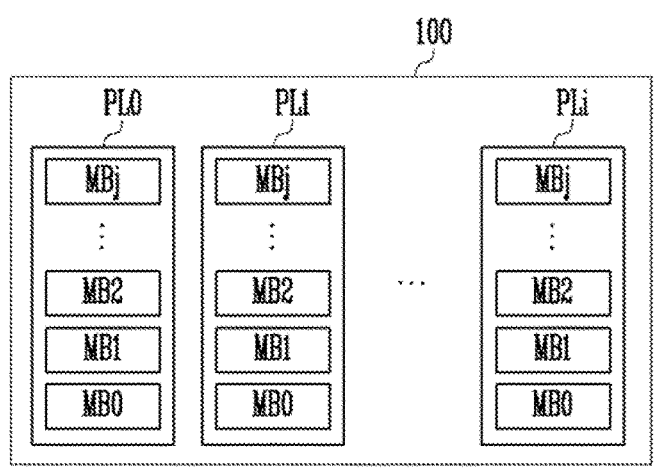
FIG. 7 is a diagram illustrating an exemplary configuration of a memory cell array employed in the memory device of FIG. 4.

FIG. 7 is a diagram illustrating an exemplary configuration of the memory cell array shown in FIG. 4.

Referring to FIG. 7, the memory cell array 100 may include a plurality of planes PL0 to PLi (where i is a positive integer). The planes PL0 to PLi may have substantially the same configuration. Each of the planes PL0 to PLi may include a plurality of memory blocks MB0 to MBj. A program status of the memory blocks MB0 to MBj may vary according to each of the planes PL0 to PLi. The memory blocks MB0 to MBj may have a two-dimensional or three-dimensional structure. Preferably, the memory blocks MB0 to MBj may generally have a three-dimensional structure for improving the integration of the memory device. A three-dimensionally structured memory block is described in detail below.

Figure 8:
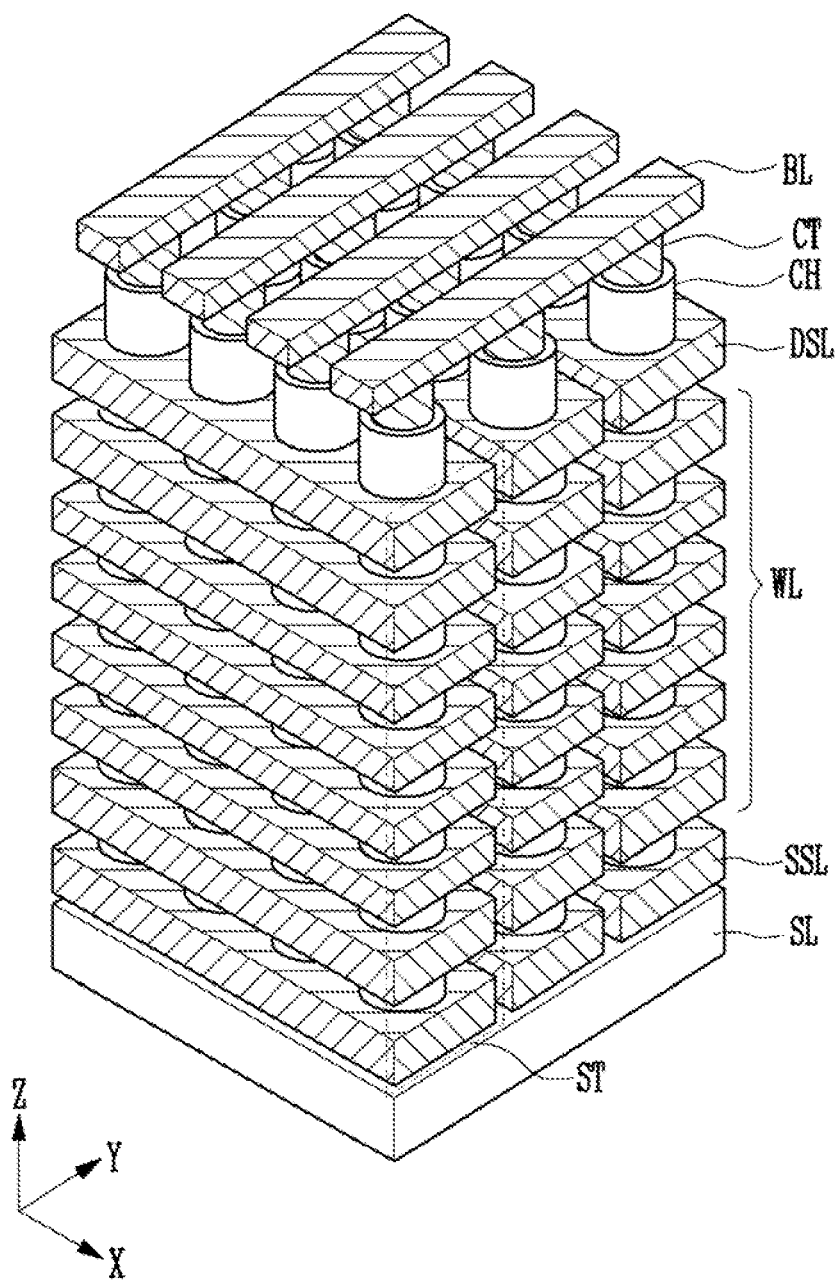
FIG. 8 is a perspective view of an exemplary three-dimensional memory cell array, according to an embodiment of the present invention.

FIG. 8 is a perspective view illustrating a memory block employed in the memory device of FIG. 4 having a three-dimension structure.

Referring to FIG. 8, the three-dimensionally structured memory block may have an 'I' shape in a vertical direction (Z direction) with respect to a substrate and include strings ST arranged between bit lines BL and the source line SL. This structure is known as a Bit Cost Scalable (BiCS) structure. For example, when the source line SL is formed in a horizontal direction to the substrate, the cell strings ST having the BiCS structure may be formed in the vertical direction to the source line SL. More specifically, the cell strings ST may include source selection lines SSL, word lines WL and drain selection lines DSL that are arranged in a first direction (Y direction) and stacked on top of each other and separated from each other. However, the numbers of source selection lines SSL, word lines WL and the drain selection lines DSL are not limited to the numbers shown in FIG. 8 and may vary depending on each memory device. Memory cells may be formed between vertical channel layers CH and the word lines WL. The cell strings ST may include vertical channel layers CH and the bit lines BL. The vertical channel layers CH may vertically penetrate the source selection lines SSL, the word lines WL and the drain selection lines DSL. The bit lines BL may contact top portions of the vertical channel layers CH which protrude above the drain selection lines DSL and are arranged in a second direction (X direction) perpendicular to the first direction (Y direction). The memory cells may be formed between the word lines WL and the vertical channel layers CH. Contact plugs CT may be further formed between the bit lines BL and the vertical channel layers CH.

Figure 9:
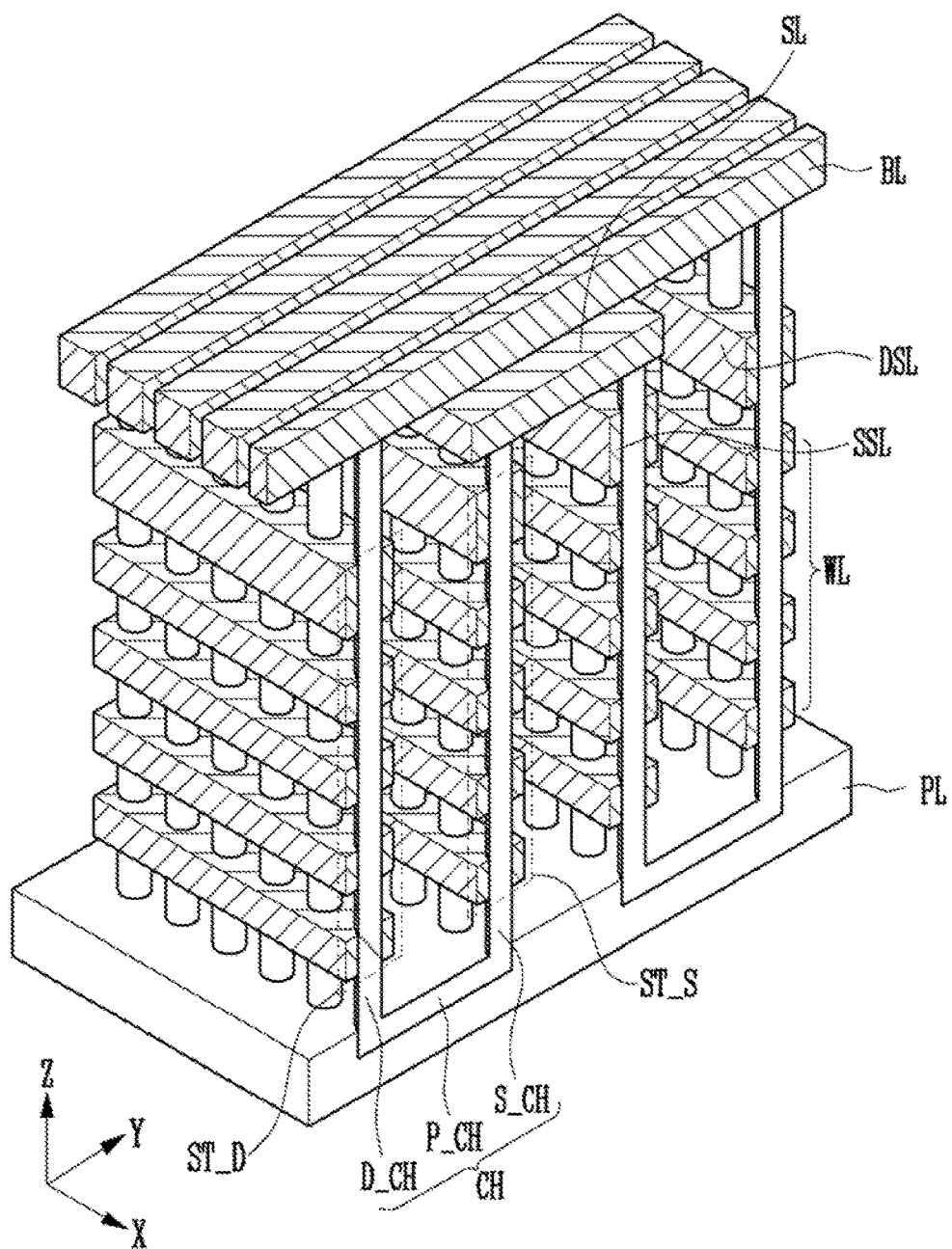
FIG. 9 is a perspective view of another exemplary three-dimensional memory cell array, according to an embodiment of the present invention.

FIG. 9 is a perspective view illustrating another exemplary configuration of a three-dimensional memory block of FIG. 4.

Referring to FIG. 9, a three-dimensionally structured memory block may be formed in a U shape in a vertical direction (Z direction) to the substrate, and include source strings ST_S and drain strings ST_D that are coupled between the bit lines BL and the source line SL. The source strings ST_S and the drain strings ST_D may be coupled to each other through pipe channels P_CH to form a 'U' shape. The pipe channels P_CH may be coupled to a pipe line PL. More specifically, the source strings ST_S may be arranged in a vertical direction between the source lines SL and the pipe line PL, and the drain strings ST_D may be arranged in the vertical direction between the bit lines BL and the pipe line PL. This structure may be called Pipe-shaped Bit Cost Scalable (P-BiCS).

More specifically, the drain strings ST_D may include the word lines WL and drain selection line DSL arranged in the first direction (Y direction) and stacked on top of each other to be separated from each other, and drain vertical channel layers D_CH vertically penetrating the word lines WL and the drain selection line DSL. The source strings ST_S may include the word lines WL and the source selection line SSL arranged in the first direction (Y direction) to be separated from each other, and source vertical channel layers S_CH vertically penetrating the word lines WL and the source selection line SSL. The drain vertical channel layers D_CH and the source vertical channel layers S_CH may be coupled to each other by the pipe channels P_CH in the pipe line PL. The bit lines BL may contact top portions of the drain vertical channel layers D_CH protruding above the drain selection lines DSL and be arranged in a second direction (X direction) perpendicular to a first direction (Y direction). Memory cells may be formed between the source vertical channel layers S_CH and the word lines WL and between the drain vertical channel layers D_CH and the word lines WL.

Figure 10:
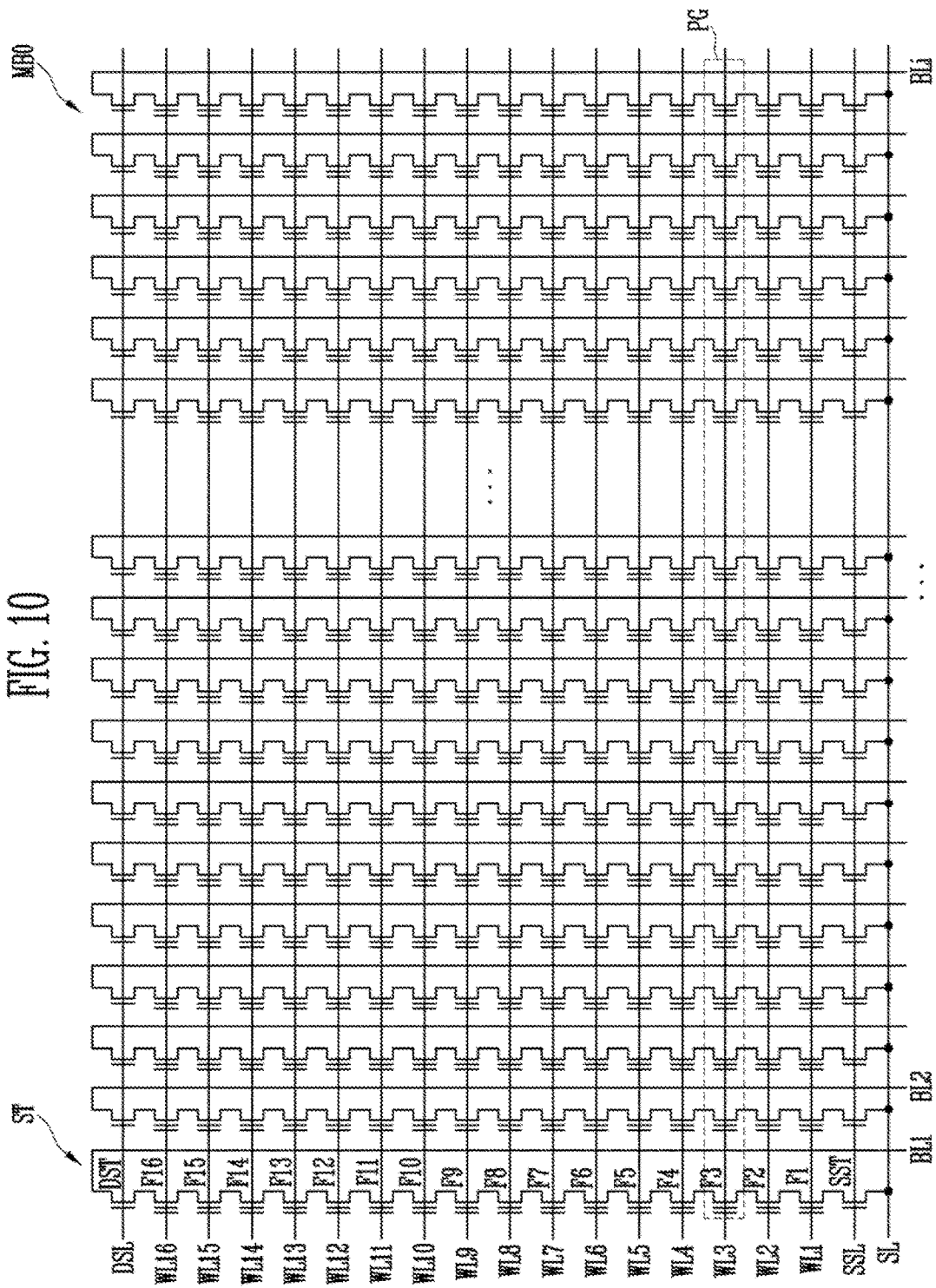
FIG. 10 is a circuit diagram illustrating a memory block employed in a memory device, according to an embodiment of the present invention.

FIG. 10 is a detailed circuit diagram illustrating a memory block, according to an embodiment.

Referring to FIG. 10, the memory block MB0 may include the cell strings ST coupled between the bit lines BL1 to BLi (where i is a positive integer) and the source line SL. The bit lines BL1 to BLi may be coupled to the cell strings ST, and the source line SL may be coupled in common to the cell strings ST. Since the cell strings ST have the same configuration as each other, a more detailed description will be given by taking the cell string ST coupled to the first bit line BL1 as an example.

The cell string ST may include a source selection transistor SST, a plurality of memory cells F1 to F16 and a drain selection transistor DST which are coupled in series between the source line SL and the first bit line BL1. Each of the cell strings ST may include at least one source selection transistor SST, at least one drain selection transistor DST, and more memory cells F1 to F16 than those shown in FIG. 10.

A source of the source selection transistor SST may be coupled to the source line SL, and a drain of the drain selection transistor DST may be coupled to the first bit line BL1. The memory cells F1 to F16 may be coupled in series between the source selection transistor SST and the drain selection transistor DST. Gates of the source selection transistors SST included in different cell strings ST may be coupled to the source selection line SSL, gates of the drain selection transistors DST may be coupled to the drain selection line DSL, and gates of the memory cells F1 to F16 may be coupled to a plurality of word lines WL1 to WL16. A group of memory cells coupled to the same word line, among memory cells included in different cell strings ST, may be referred to as a page PG. Therefore, a memory block may include as many pages PG as the number of word lines WL1 to WL16.

Figure 11:
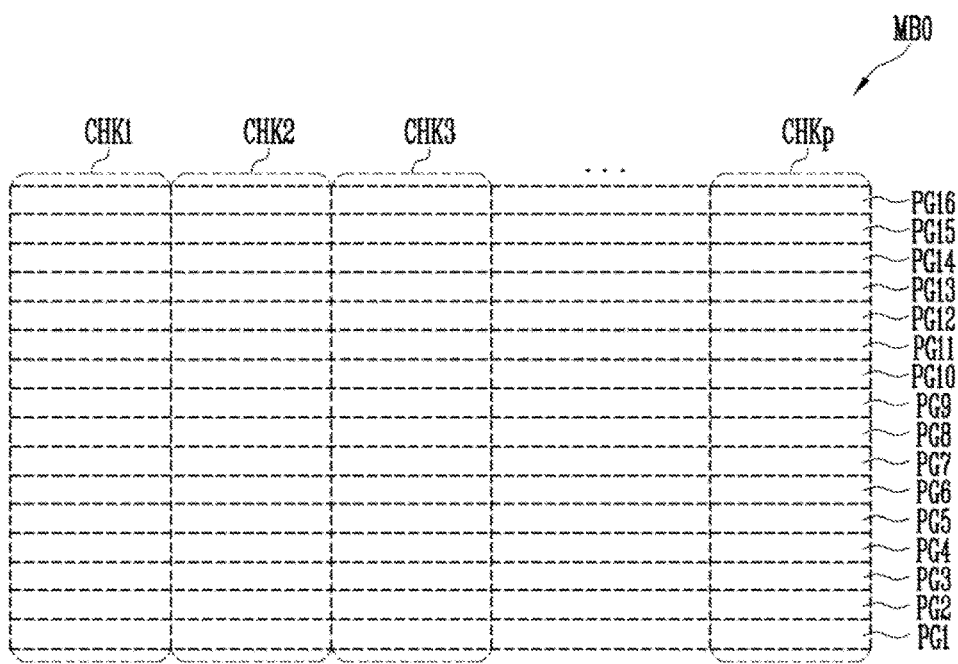
FIG. 11 is a diagram illustrating a memory block including a plurality of chunks, according to an embodiment of the present invention.

FIG. 11 is a diagram illustrating a memory block divided into a plurality of chunks.

Referring to FIGS. 10 and 11, program and read operations may be performed in units of the pages PG. The increase in degree of integration of a memory device may result in the increase in number of cell strings ST and also the increase in capacity of the page PG. Thus, data of the selected page PG may be divided into units of "chunks." Therefore, the cell strings ST included in the memory block MB0 may be divided into a plurality of chunks CHK1 to CHKp (where p is a positive integer). For example, a sensing operation may be performed such that data of memory cells of the selected page may be sensed in a sequential manner from memory cells included in the first chunk CHK1 to memory cells included in the pth chunk CHKp.

A method of searching for an erase page according to an embodiment is described below.

Figure 12:
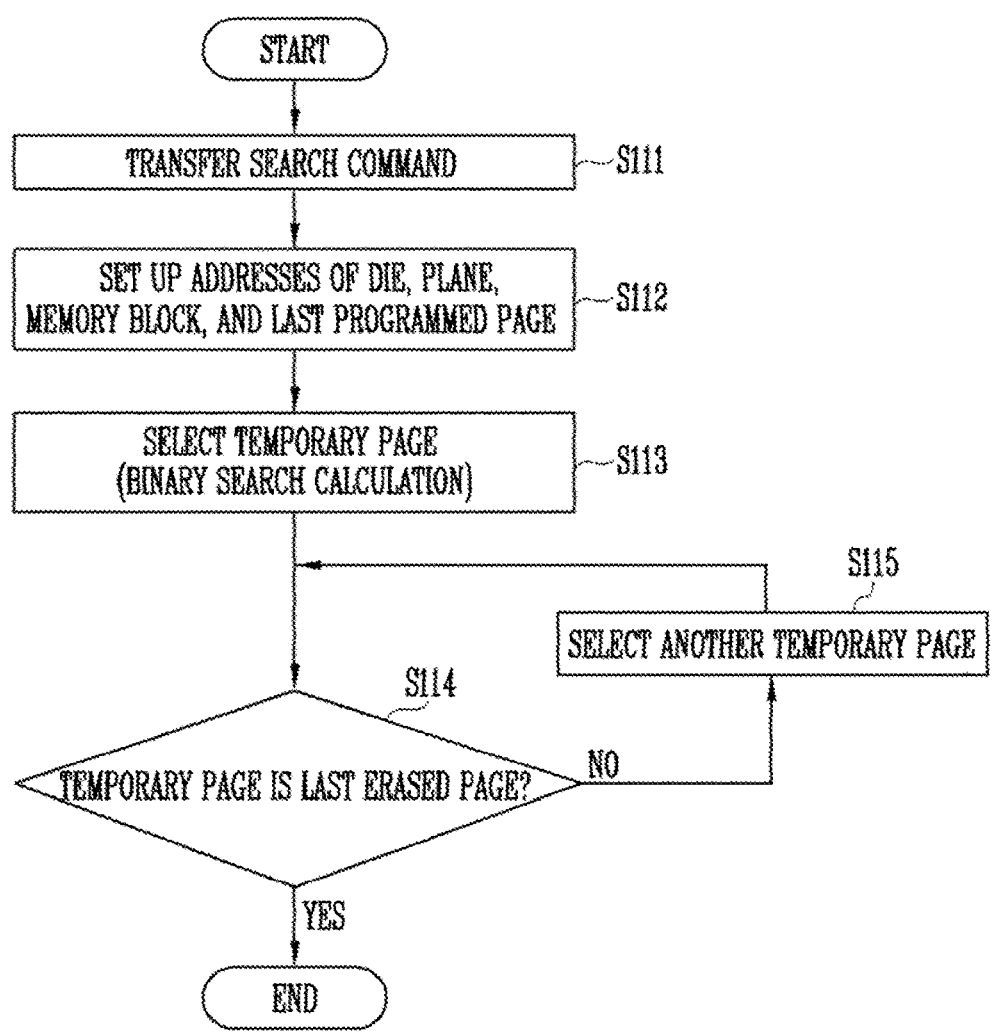
FIG. 12 is a flowchart of a method of searching for an erased page, according to an embodiment of the present invention.

FIG. 12 is flowchart illustrating a method of searching for an erase page according to an embodiment.

Referring to FIGS. 1, 2 and 12, when the memory system 1100 is powered on, the memory controller 1120 included in the memory system 1100 may transfer a search command to the storage device 1110 at step S111. The search command may be for searching for an erase page.

At step S112, the memory controller 1120 may determine addresses of a lastly programmed page and corresponding memory device (e.g., a die), plane, and memory block from information stored in the address storage unit 1121.

Then, the storage device 1110 may select a temporary page by binary search calculation at step S113.

The memory device, which is selected according to the determination of step S112, may search for a last erased page by binary search calculation at steps S114 to S115. For example, the selected memory device may determine whether the selected temporary page is the last erased page at step S114. When the selected temporary page is determined not the last erased page (i.e., "No") at step S114, another temporary page may be selected by the binary search calculation of the storage device 1110 at step S115 and steps S114 and S115 may be repeated until the selected temporary page is determined as the last erased page. When the temporary page is determined as the last erased page (i.e., "Yes") at step S114, the search operation for the last erased page may be terminated. As described with reference to FIG. 2, the address ADD_PAGE of the last erased page may be provided to the address storage unit 1121 of the memory controller 1120 and the address of the last erased page in the address storage unit 1121 may be updated by the provided address ADD_PAGE of the last erased page.

An embodiment using the above-described method is described below in detail with reference to FIGS. 1 to 13.

Figure 13:
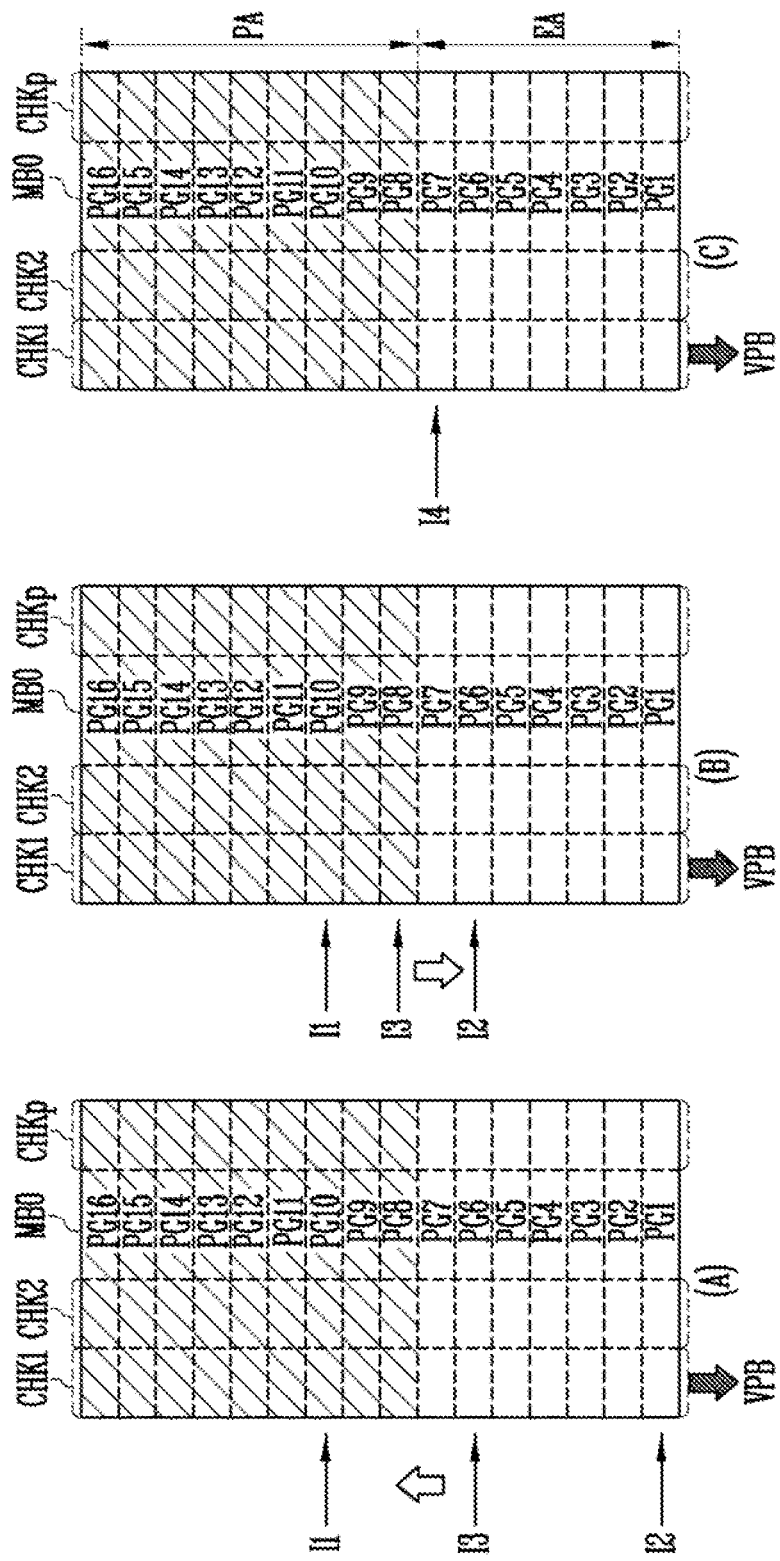
FIG. 13 is a diagram of a selected memory block illustrating the method of FIG. 12.

FIG. 13 is a schematic diagram of a selected memory block illustrating the method of FIG. 12.

It is assumed that the selected memory block MB0 includes first to sixteenth pages PG1 to PG16 and a program operation is performed in descending order from the sixteenth page PG16 to the first page PG1. In addition, it is also assumed that sixteenth to eighth pages PG16 to PG8 are program-completed pages and seventh to first pages PG7 to PG1 are erased pages.

Referring to FIGS. 1 to 12 and (A) of FIG. 13, an address of a last programmed page, which is determined at step S112, may be set as a first address I1. For example, the address of the last programmed page may be stored in the address storage unit 1121 of the memory controller 1120 before the memory system 1100 is powered off. However, when the memory system 1100 is abnormally powered off, the address of the last programmed page may not be stored in the memory controller. FIG. 13 illustrates that a page other than the eighth page PG8, which is the last programmed page, is stored as the last programmed page in the address storage unit 1121 of the memory controller 1120. A case in which the tenth page PG10 is stored as the last programmed page in the address storage unit 1121 due to an abrupt power off of the memory system 1100 is described below.

At step S113 of FIG. 12, the tenth page PG10, the address of which is stored in the address storage unit 1121 of the memory controller 1120 and is determined at step S112 as the address of the last programmed page due to an abrupt power off of the memory system 1100, may be set as the first address I1, and the binary search calculation using this first address I1 may be performed. For performing the binary search calculation, an address of the first page PG1 of the memory block MB0, which is the last possible page to be programmed during a program operation, may be set as a second address I2. The second address I2 may be included in the address stored in the address storage unit 1121. The first page PG1 of the memory block MB0, is the last possible page to be programmed during a program operation because, in this example, it is assumed that a program operation is performed in descending order from the sixteenth page PG16 to the first page PG1 of the memory bock MB0.

At step S113 of FIG. 12, a temporary page is selected using a binary search calculation. More specifically, a median value of the first and second addresses I1 and I2 i.e., a median value of the tenth and first pages PG10 and PG1 may be obtained and defined as a third address I3 of the temporary page. That is, the storage device 1110 may select the temporary page having an address equal to the median value of the first and second addresses, at step S113. When the median value of the first and second addresses I1 and I2 does not exactly correspond to a single address, that is, when a result value of '(I1−I2)/2' does not exactly correspond to a single address, one of addresses having values nearest to the median value may be defined as the third address I3 of the temporary page. As illustrated in (A) of FIG. 13, when the first address I1 is the tenth page PG10, the second address I2 is the first page PG1, then the sixth page PG6 is selected as a page corresponding to a median value thereof. The address of the sixth page PG6 may be set as the third address I3, i.e. the temporary page.

Subsequently, at step S114 of FIG. 12, it may be determined whether the selected temporary page, i.e., the sixth page PG6 corresponding to the third address I3 is the last erased page. More specifically, it may first be determined whether the selected temporary page, i.e., the sixth page PG6 corresponding to the third address I3 is a programmed page or an erased page. An operation of determining whether the sixth page PG6 is a programmed page or an erased page may be performed by the current sensing circuit 260. More specifically, the current sensing circuit 260 may output the pass signal PASS or the fail signal FAIL according to whether or not the selected temporary page is a programmed page. For example, when the selected temporary page is a programmed page, the sensing voltage VPB may increase and the current sensing circuit 260 outputs the pass signal PASS. The sensing voltage VPB is reduced when the selected temporary page is an erased page, and the current sensing circuit 260 outputs the fail signal FAIL. To reduce the operating time, the memory device D0 as shown in FIG. 4 may not provide information relating to pass or fail of the selected temporary page to the memory controller 1120. In other words, the control logic 300 determines whether the selected temporary page is a programmed or an erased page, and controls the peripheral circuit 200 to perform the binary search calculation according to a determination result.

In addition, the operation of determining whether the selected temporary page, e.g., the sixth page PG6 in the example of FIG. 13 is a programmed page or an erased page may be performed on several chunks, e.g., one of CHK1 to CHKp other than the entire selected temporary page in order to reduce the operating time. For example, when a large number of memory cells are included in a page, it may be difficult to perform a sensing operation on the entire selected page. Thus, the sensing operation may be performed by dividing the selected page in units of chunks. To reduce operating time, the sensing operation may be performed on some or one of the chunks CHK1 to CHKp. When the selected temporary page (e.g., the sixth page PG6) is an erased page, the number of fail bits may be greater than the number of allowed bits no matter which chunk of the selected temporary page is selected. Thus, a sensing operation is not needed to be performed on all chunks CHK1 to CHKp of the temporary page. In other words, since the number of fail bits of some chunks in the selected temporary page represents the sensing fail or sensing pass of the selected temporary page, a sensing operation to determine whether the selected temporary page is a programmed page or an erased page may be performed on one or more of the chunks of the temporary page. For example, when a sensing operation is performed by detecting a fail bit with only the sensing voltage VPB of the first chunk CHK1, a sensing operation of the remaining chunks CHK2 to CHKp may be skipped so that the time taken to perform the sensing operation to the selected temporary page may be reduced.

Then, at step S114, when the sixth page PG6 corresponding to the third address I3 is determined to be an erased page, but not the last erased page, (NO at step S114), the search for the last erased page is repeated by selecting another temporary page using the binary search calculation at step S115. More specifically, a new temporary page is selected having an address that is a median of the third and the first addresses I3 and I1. Because the previous selected temporary page was determined to be an erased page and in this example a program operation is performed in descending order from the sixteenth page PG16 to the first page PG1, at step S115, a new address I3 having a higher value than the previous third address I3 may be searched for selecting the next temporary page.

At step S115, the address of the previous temporary page or the sixth page PG6 may be set to the second address I2 (see (B) of FIG. 13). Subsequently, the address of the eighth page PG8 which is the median between the first address I1 and the second address I2 may be defined as the new third address I3. Therefore, the eighth page PG8 may be selected as the new temporary page at step S115. Then step S114 is repeated and when the eighth page PG8 is determined to be a programmed page (i.e. not the last erased page), step 115 is repeated to select a new temporary page. It is noted that, as described above, the operation of determining whether the eighth page PG8 is a programmed page or an erased page may be performed on only the first chunk CHK1, so that the operation time can be significantly reduced.

More specifically, at step 115, the last erased page may be searched again through selection of another temporary page between the third address I3 and the second address I2 by employing the binary search calculation at step S115. Because the previous selected temporary page, i.e., the PG8 page was determined to be a programmed page, and in this example a program operation is performed in descending order from the sixteenth page PG16 to the first page PG1, an address having a lower value than the third address I3 and which is the median of the third and second addresses I3 and I2 is searched for selecting another temporary page at step S115.

More specifically, referring to (C) of FIG. 13, the address of the previous selected temporary page (i.e., the eighth page PG8) may be set to the first address I1 at step S115. An address of the seventh page PG7 having the median value between the first address I1 of the eighth page PG8 and the second address I2 of the sixth page PG6 may be defined as the third address I3. Therefore, the seventh page PG7 may be selected as another temporary page at step S115. Then, when the seventh page PG7 is determined as an erased page at step S114, the seventh page PG7 may also be determined to be the last erased page. A fourth address I4 of the seventh page PG7 may be stored as the last erased page address ADD_PAGE in the address storage unit 1121 of the memory controller 1120. As described above, the operation of determining whether or not the seventh page PG7 is a programmed page or an erased page may be performed on only the first chunk CHK1, so that operation time may be reduced.

Figure 14:
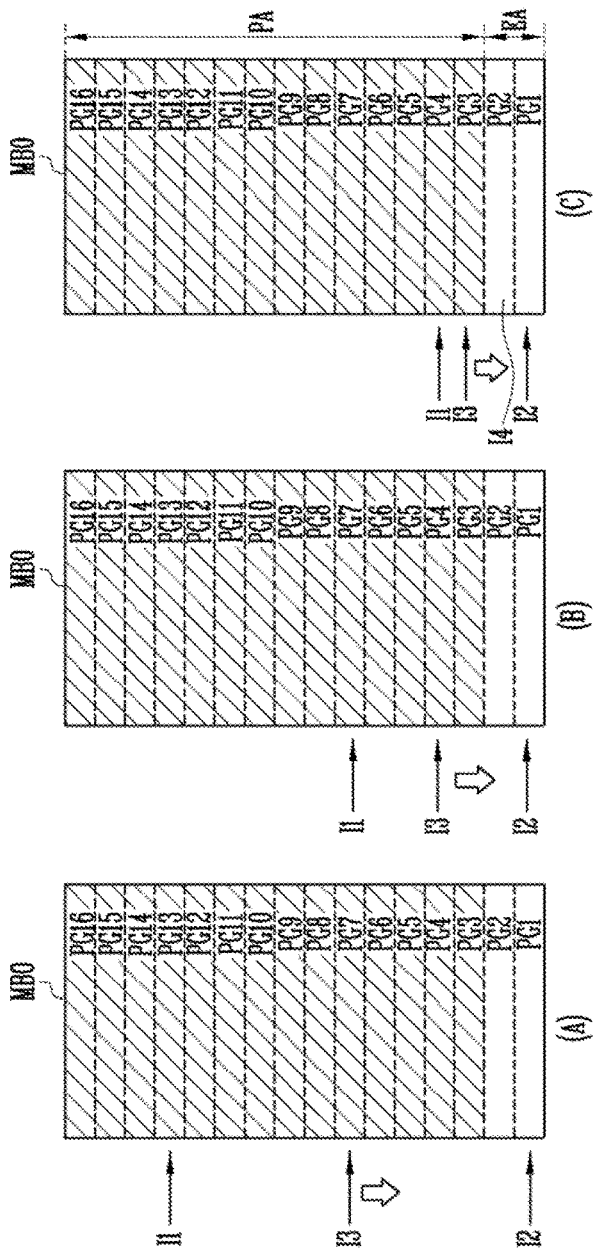
FIG. 14 is a diagram of a selected memory block further illustrating the method of FIG. 12.

FIG. 14 is a schematic diagram of a selected memory block illustrating another example of the method of FIG. 12.

It is assumed that the selected memory block MB0 includes first to sixteenth pages PG1 to PG16 and a program operation is performed in descending order from the sixteenth page PG16 to the first page PG1. In addition, it is also assumed that sixteenth to third pages PG16 to PG3 are program-completed pages and second to first pages PG2 to PG1 are erased pages. In addition, the operation of determining whether the temporary page is programmed or erased may be performed on a single or several chunks as described above with reference to FIG. 13.

Referring to FIGS. 1 to 12 and FIG. 14(A), an address of the last programmed page, which is determined at step S112, may be set as a first address I1. For example, the address of the last programmed page may be stored in the address storage unit 1121 of the memory controller 1120 before the memory system 1100 is powered off. However, when the memory system 1100 is abnormally powered off, the address of the lastly programmed page may not be stored in the memory controller. FIG. 14 illustrates that a page other than the third page PG3, which is the last programmed page, is stored as the last programmed page in the address storage unit 1121 of the memory controller 1120. A case in which the thirteenth page PG13 is stored as the last programmed page in the address storage unit 1121 due to the abrupt power off of the memory system 1100 is described below.

At step S113 of FIG. 12, the thirteenth page PG13, the address of which is stored in the address storage unit 1121 of the memory controller 1120 and is determined at step S112 as the address of the last programmed page due to the abrupt power off of the memory system 1100, may be set as the first address I1, and the binary search calculation using this first address I1 may be performed. For the binary search calculation, an address of the first page PG1, which is last in order of the program operation, may be set to a second address I2. As described above, it is assumed that a program operation is performed in descending order from the sixteenth page PG16 to the first page PG1.

At step S113 of FIG. 12, a median value of the first and second addresses I1 and I2 of the thirteenth and first pages PG13 and PG1 may be obtained. The median value may be defined as a third address I3 of the temporary page. That is, the storage device 1110 may select the temporary page having the median value at step S113. When the median value of the first and second addresses I1 and I2 does not exactly correspond to a single address, that is, when a result value of '(I1−I2)/2' does not exactly correspond to a single address, one of addresses having values nearest to the median value may be defined as the third address I3 of the temporary page. (A) of FIG. 14 illustrates an address of the seventh page PG7, which is the one of addresses having values nearest to the median value of the first and second addresses I1 and I2, defined as the third address I3. The seventh page PG7 of the third address I3 may be selected as the temporary page at step S113.

At step S114 of FIG. 12, it may be determined whether the seventh page PG7 corresponding to the third address I3 is a programmed page or an erased page. The operation of determining whether the seventh page PG7 is a programmed page or an erased page may be performed by using the current sensing circuit 260. Since this is described in connection with FIG. 13, a detailed description thereof is omitted.

At step S114 of FIG. 12, when the seventh page PG7 corresponding to the third address I3 is determined as a programmed page, the last erased page may be searched again through selection of another temporary page between the third address I3 and the first address I1 by the binary search calculation at step S115. In other words, an address having a lower value than the third address I3 may be searched for selecting another temporary page at step S115.

The address of the previous temporary page or the seventh page PG7 may be set to the first address I1 at step S115, (See (B) of FIG. 14). Subsequently, an address of the fourth page PG4 having the median value between the first address I1 and the second address I2 may be defined as the third address I3. Therefore, the fourth page PG4 may be selected as another temporary page at step S115. When the fourth page PG4 is determined as a programmed page at step S114, the last erased page may be searched again through selection of another temporary page between the third address I3 and the second address I2 by the binary search calculation at step S115. In other words, an address having a lower value than the third address I3 may be searched for selecting another temporary page at step S115.

Referring to FIG. 12 and (C) of FIG. 14, the address of the previous temporary page or the fourth page PG4 may be set to the first address I1 at step S115. Referring to (C) of FIG. 14, the third and second pages PG3 and PG2 may be included between the first address I1 of the fourth page PG4 and the second address I2 of the first page PG1. When an address of the third page PG3 is set as the third address I3, the third page PG3 may be determined as the programmed page. Thus, the address of the second page PG2 may be set as the third address I3 and then the third address I3 of the second page PG2 may be set as the fourth address I4 since the second page PG2 is determined as an erased page by the above-described binary search algorithm. A fourth address I4 of the temporary page or the second page PG2 may be provided to address storage unit 1121 of the memory controller 1120. In other words, the fourth address I4 of the second page PG2 may be stored as the last erased page address ADD_PAGE in the address storage unit 1121 of the memory controller 1120.

Figure 15:
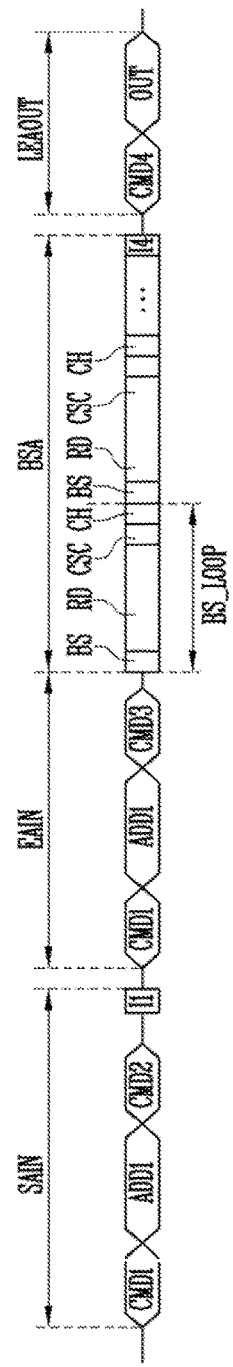
FIG. 15 is a timing diagram illustrating an operation between a memory controller and a memory device in a memory system, according to an embodiment of the present invention.

FIG. 15 is a timing diagram illustrating an operation between the memory controller 1120 and the memory device according to an embodiment of the present invention.

Referring to FIGS. 1 to 15, when the memory system 1100 is powered on, the memory controller 1120 may control the storage device 1110 to perform an operation of determining a status of the storage device 1110. For example, the memory controller 1120 may control the storage device 1110 so that at least one of the memory devices included in the storage device 1110 may perform a search operation to obtain an address of a last erased page for the at least one memory device. The search operation may include a start address command step SAIN, a last address command step EAIN, a binary search algorithm performing step BSA and a last erased page address outputting step LEAOUT. During the search operation, the memory controller 1120 may provide to the storage device 1110 only the commands and the addresses needed for the search operation. The storage device 1110 receiving the commands and the addresses may perform the search operation to determine the last erased page address for the at least one memory device and provide the last erased page address for the at least one memory device to the memory controller 1120. The steps SAIN, EAIN, BSA and LEAOUT performed during the search operation are described below in detail.

During the start address command step SAIN, the memory controller 1120 may provide a search command CMD1 to the storage device 1110 so that the storage device 1110 may perform a search operation. Subsequently, the memory controller 1120 may provide a first search address ADD1 to the storage device 1110. The first search address ADD1 may include addresses of a memory device, a plane and a memory block on which the search operation is to be performed. After the first search address ADD1 is provided, the memory controller 1120 may sequentially provide a start address command CMD2 and a start address I1 to the storage device 1110. The start address I1 may be the one stored in the address storage unit 1121 of the memory controller 1120. The start address may represent the last programmed page, which may be different from an actual last programmed page due to the sudden power-off of the memory system 1100. For example, the selected memory device in the storage device 1110 may be ready to receive the start address I1 in response to the start address command CMD2 and set the start address I1 as the first address I1 as shown in FIG. 13 or 14 when receiving the start address I1.

When the last address command operation EAIN starts, the memory controller 1120 may provide the search command CMD1 and the first search address ADD1 to the storage device 1110 again and provide the last address command CMD3 to the storage device 1110.

During the binary search algorithm performing step BSA, a plurality of search loops BS_LOOP may be performed until the last erased page is detected. Each of the search loops BS_LOOP may include a binary calculation step BS, a read step RD, a sensing step CSC and a determination step CH.

At the binary calculation step BS, binary calculation of the first and second addresses I1 and I2 of FIG. 13 or 14 may be performed to generate the third address I3 of FIG. 13 or 14.

At the read step RD, a selected temporary page may be read according to the third address I3 generated at the binary calculation step BS.

At the sensing step CSC, a voltage or current in the selected temporary page read at the read step RD may be sensed. For example, the sensing step CSC may be performed by the current sensing circuit 260.

At the determination step CH, it may be determined whether the selected temporary page is the last erased page which includes determining whether the selected temporary page is a programmed page or an erased page according to a sensing result of the sensing step CSC.

When it is determined that the selected temporary page is not the last erased page, another temporary page may be selected and the search loop BS_LOOP may be performed again.

As a result of performing the search loop BS_LOOP, when the temporary page is determined as the last erased page, an address of the temporary page may be set as the fourth address I4. When the fourth address I4 is set, the selected memory device may provide the memory controller 1120 with a signal indicating that the fourth address I4 is set.

During the last erased page address outputting step LEAOUT, the memory controller 1120 may provide an output command CMD4 to the selected memory device in response to the signal indicating that the fourth address I4 is set. The selected memory device may output the fourth address I4 as the last erased page address ADD_PAGE in response to the output command CMD4.

The memory controller 1120 may receive the last erased page address ADD_PAGE and control the storage device 1110 to perform subsequent operations on the basis of the erase page address ADD_PAGE.

Figure 16:
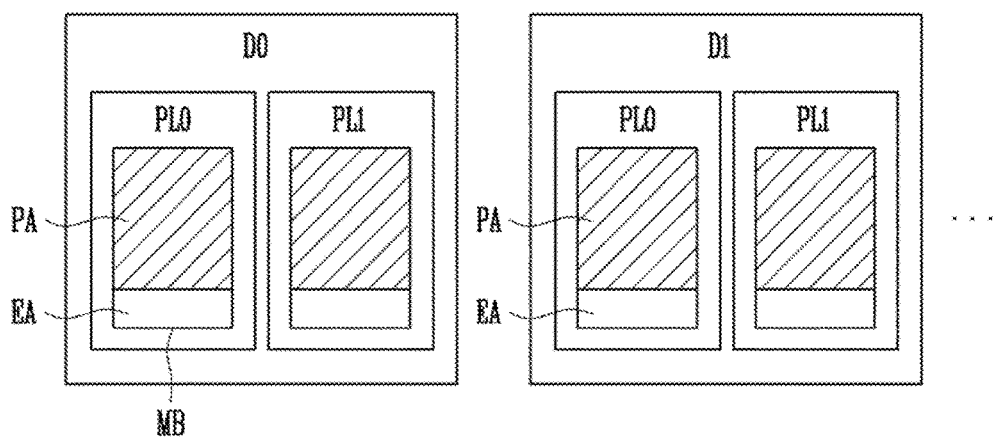
FIG. 16 is a diagram of a plurality of memory devices illustrating an exemplary application of the invention.

FIG. 16 is a diagram of a plurality of memory devices illustrating an application example of an embodiment of the invention.

Referring to FIG. 16, when a first plane PL0 is selected between the first and second planes PL0 and PL1 included in the first memory device D0, a pattern of the program area PA, where the programmed pages are included, and the erase area EA, where the erased pages are included, of a selected memory block MB included in the first plane PL0 may be similar to that of the selected memory block in the second plane PL1. To reduce the time taken to search for the last erased page, an address may be set in a memory block of another plane (e.g., second plane PL1) included in the same memory device with reference to the address of the lastly erased page in a previous selected memory block. Therefore, the time taken to perform the binary search algorithm may be reduced. When all last erased pages of the memory devices included in the first memory device D0 are detected, in the second memory device D1, each memory block may be searched for the last erased page on the basis of the start address regarding the first memory device D0 and stored in the memory controller 1120.

Figure 17:
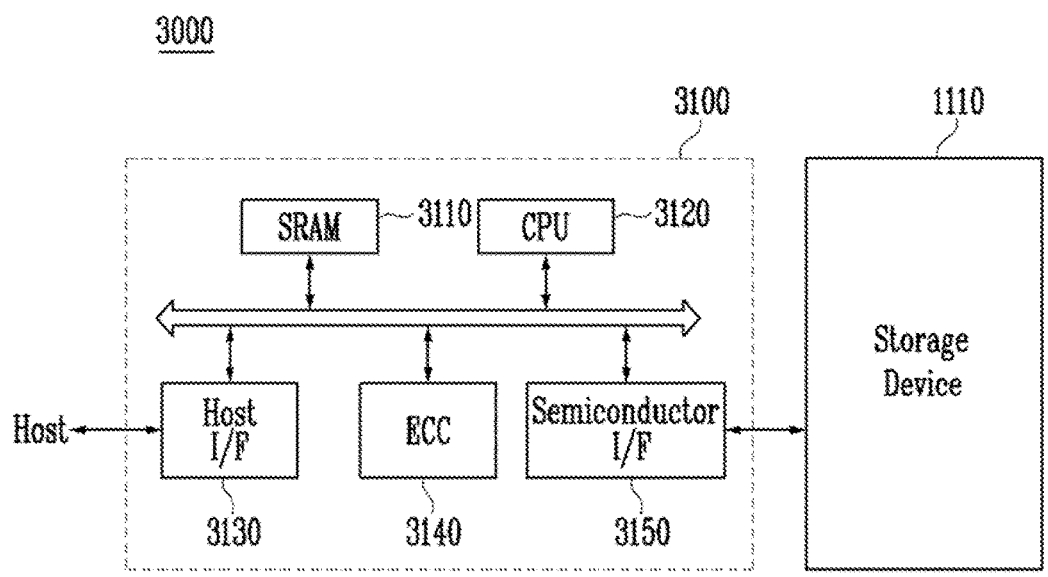
FIG. 17 is a diagram illustrating a memory system including a memory device, according to an embodiment of the present invention.

FIG. 17 is a diagram illustrating a memory system 3000 including the storage device 1110 according to an embodiment. Since the storage device 1110 may be configured in substantially the same manner as described above with reference to FIG. 4, a detailed description of the storage device 1110 is omitted.

Referring to FIG. 17, a memory system 3000 may include a memory controller 3100 and the storage device 1110. The memory controller 3100 may be configured to control the storage device 1110 and have various configurations in addition to the configuration described with reference to FIG. 2. The SRAM 3110 may serve as a working memory of a CPU 3120. A host interface 3130 may include a data exchange protocol of a host coupled to the memory system 3000. An error correction circuit (ECC) 3140 provided in the control unit 3100 may detect and correct errors in data read from the storage device 1110. A semiconductor interface 3150 may interface with the storage device 1110. The CPU 3120 may perform a control operation for data exchange of the control unit 3100. In addition, though not shown in FIG. 11, the memory system 3000 may further include ROM (not illustrated) storing code data for interfacing with the host.

The memory system 3000 may be applied to one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

Figure 18:
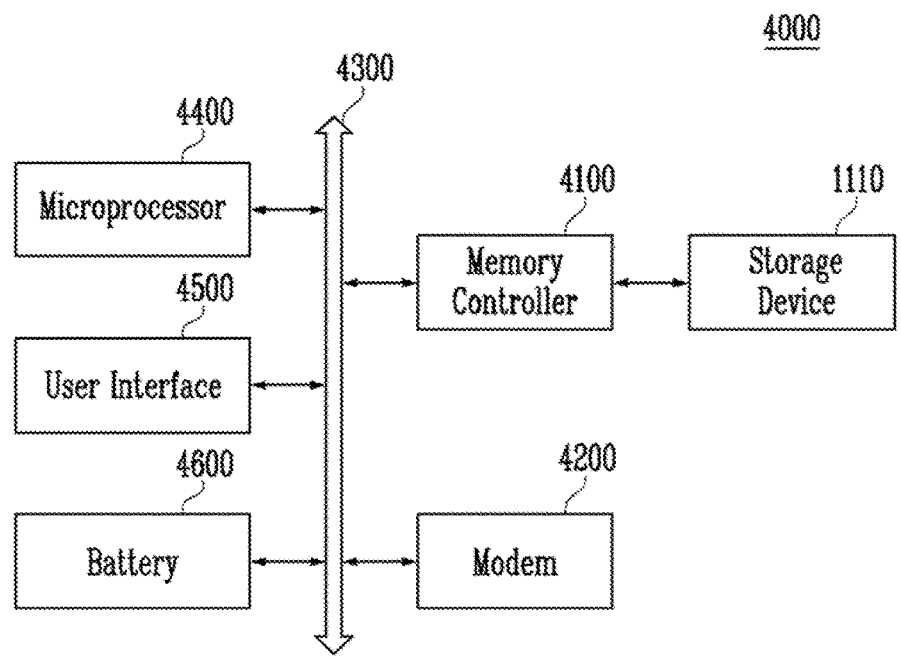
FIG. 18 is a diagram illustrating the configuration of a computing system including a memory device, according to an embodiment of the present invention.

FIG. 18 is a diagram illustrating a configuration of a computing system 4000 including a storage device, according to an embodiment. Since the storage device 1110 may have substantially the same configuration as shown above with reference to FIG. 4, a detailed description of the storage device 1110 is omitted.

Referring to FIG. 18, the computing system 4000 may include the storage device 1110, a memory controller 4100, a modem 4200, a microprocessor 4400, and a user interface 4500 which are electrically coupled to a bus 4300. When the computing system 4000 is a mobile device, a battery 4600 for supplying an operation voltage of the computing system 4000 may be additionally provided. Though not illustrated in FIG. 18, the computing system 4000 may include an application chip set (not shown), a camera image processor (CIS) (not shown), a mobile DRAM (not shown), and the like.

The memory controller 4100 and the storage device 1110 may be components of a Solid State Drive/Disk (SSD).

The computing system 4000 may be mounted using various types of packages. For example, the computing system 4000 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

According to an embodiment, since a memory device instead of a memory controller performs an operation of determining a status of pages included in a memory block, operating efficiency of the memory controller may be improved.

In addition, by performing a binary search calculation, operating time for searching a memory block for an erased page may be reduced.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A memory system, comprising:
a memory controller; and
a memory device including a plurality of memory blocks which include a plurality of pages each of which is composed of a plurality of chunks, operatively coupled to the memory controller,
wherein the memory device is configured to detect a last erased page among the plurality of pages by sensing a portion of chunks among the plurality of chunks, and provide an address of the last erased page to the memory controller,
wherein the memory controller is configured to control the memory device according to the address of the last erased page, and
wherein the memory device searches the last erased page in a range between an address of a page stored as a last programmed page and an address of a page which is a last possible page to be programmed during a program operation.

2. The memory system of claim 1,
wherein the memory controller provides a search command to the memory device when the memory system is powered on for the memory device to detect the last erased page.

3. The memory system of claim 2,
wherein after the memory controller provides the search command to the memory device, the memory controller sequentially outputs:
addresses of a plane and the memory block included in the memory device,
a first search address,
a start address command,
a start address stored in the memory controller,
the search command,
the first search address of the plane and the memory block included in the memory device, and
a last address command.

4. The memory system of claim 3, wherein the memory controller comprises an address storage unit configured to store the addresses of the plane and the memory block, and the address of the last erased page.

5. The memory system of claim 1,
wherein the memory device selects the memory block in response to a search command and addresses of a plane and the memory block output from the memory controller, and
wherein the memory device detects the address of the last erased page among a plurality of pages included in the memory block.

6. The memory system of claim 5, wherein the memory device detects the address of the last erased page by performing binary search calculation.

7. The memory system of claim 6, wherein the memory device searches the memory block for a third address located in between a first address and a second address, and determines whether a page corresponding to the third address is a programmed page or an erased page.

8. The memory system of claim 7, wherein, when the page corresponding to the third address is the programmed page, the memory device resets a previous third address as a current first address, resets an address between the current first address and a previous second address as a current third address, and determines whether the page corresponding to the current third address is a programmed page or an erased page.

9. The memory system of claim 7, wherein the memory device includes a current sensing circuit configured to determine whether the page corresponding to the third address is a programmed page or an erased page.

10. The memory system of claim 9, wherein the current sensing circuit senses one or more of the plurality of chunks included in the page corresponding to the third address in order to determine whether the page corresponding to the third address is a programmed page or an erased page.

11. A method of operating a memory system, the method comprising:
setting two among a plurality of pages included in a memory block as first and second pages according to addresses;
setting a page located between the first and second pages as a third page;
determining whether the third page is a programmed page or an erased page by sensing a portion of chunks included in the third page; and
repeating the setting of the first and second pages, the setting of the third page, and the determining by performing the setting of the first and second pages such that the first page is moved toward the second page when the third page is determined as the programmed page or such that the second page is moved toward the first page when the third page is determined as the erased page,
wherein the first and second pages are in a range between a page stored as a last programmed page and a page which is a last possible page to be programmed during a program operation.

12. The method of claim 11, wherein the repeating of the setting of the first and second pages is performed until the third page determined as the erased page is detected as a last erased page.

13. The method of claim 11, wherein, when a previous third page is determined as the programmed page, the repeating of the setting of the first and second pages includes:
resetting the previous third page as a current first page,
resetting a page located between the current first page and a previous second page as a current third page, and
determining whether the current third page is a programmed page or an erased page.

14. The method of claim 11, wherein, when a previous third page is determined as the erased page, the repeating of the setting of the first and second pages includes:
resetting the previous third page to a current second page;
resetting a page located between a previous first page and the current second page as a current third page; and determining whether the current third page is a programmed or erased.

15. A method of operating a memory system, the method comprising:
   outputting a search command and addresses from a memory controller;
   selecting a memory block in response to the search command and the addresses;
   calculating a first address and a second address included in the addresses to set an address between the first and second addresses as a third address;
   determining whether a page corresponding to the third address among pages included in the selected memory block is programmed or erased by sensing a portion of chunks among a plurality of chunks included in the page corresponding to the third address; and
   repeating the calculating and the determining by changing the third address in the range between the first and second addresses until the page corresponding to the third address determined as the erased page is detected as a last erased page,
   wherein the first address and the second address are in a range between an address of a page stored as a last programmed page and an address of a page which is a last possible page to be programmed during a program operation.

16. The method of claim 15, wherein the addresses output from the memory controller further include addresses of a memory device, a plane, and a memory block.

17. The method of claim 16, wherein the repeating changes the third address by changing one of the first and second addresses depending on whether the page corresponding to the third address is a programmed page or an erased page.

18. The method of claim 17, wherein, when the page corresponding to a previous third address is determined as the programmed page, the repeating includes:
   resetting the previous third address as a current first address,
   resetting an address between the current first address and a previous second address as a current third address, and
   determining whether a page of the current third address is a programmed page or an erased page.

19. The method of claim 17, wherein, when the page corresponding to a previous third address is determined as the erased page, the repeating includes:
   resetting the previous third address to a current second address;
   resetting an address between a previous first address and the current second address as a current third address; and
   determining whether a page of the current third address is a programmed or erased.

* * * * *